(12) United States Patent
Guenther

(10) Patent No.: US 12,712,563 B2
(45) Date of Patent: Aug. 18, 2026

(54) MEASUREMENT APPLICATION DEVICE AND METHOD

(71) Applicant: Rohde & Schwarz GmbH & Co. KG, Munich (DE)

(72) Inventor: Thomas Guenther, Waldenburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 168 days.

(21) Appl. No.: 18/648,084

(22) Filed: Apr. 26, 2024

(65) Prior Publication Data

US 2025/0337429 A1 Oct. 30, 2025

(51) Int. Cl.
*H03M 1/10* (2006.01)
*H03M 1/06* (2006.01)
(Continued)

(52) U.S. Cl.
CPC ......... *H03M 1/125* (2013.01); *H03M 1/0626* (2013.01); *H03M 1/462* (2013.01)

(58) Field of Classification Search
CPC .... H03M 1/12; H03M 1/1076; H03M 1/1225; H03M 1/46; H03M 1/004; H03M 1/0626; H03M 1/1023; H03M 1/1085; H03M 1/0687; H03M 1/0854; H03M 1/1004; H03M 1/1038; H03M 1/1057; H03M 1/1071; H03M 1/1095; H03M 1/1245; H03M 1/125; H03M 1/181; H03M 1/188; H03M 1/205; H03M 1/36; H03M 1/361; H03M 1/38; H03M 1/462; H03M 1/66; H03M 3/378; H03M 3/384; H03M 3/458; H03M 7/165
(Continued)

(56) References Cited

U.S. PATENT DOCUMENTS 5,291,197 A * 3/1994 Abe ...................... H03M 1/004 712/43
5,438,691 A * 8/1995 Muto .................... H03M 1/188 375/317

(Continued)

FOREIGN PATENT DOCUMENTS

EP 0947841 B1 12/2004
EP 0947839 B1 10/2005
EP 0947838 B1 4/2006

*Primary Examiner* — Linh V Nguyen
(74) *Attorney, Agent, or Firm* — Patterson + Sheridan, LLP; Carleton S. Clauss

(57) ABSTRACT

The present disclosure provides a measurement application device comprising a measurement interface configured to receive an analog measurement signal, an analog-to-digital converter coupled to the measurement interface, wherein the analog-to-digital converter is configured to convert the analog measurement signal into a digital data stream, a segmented memory coupled to the analog-to-digital converter, wherein the segmented memory comprises a plurality of memory segments and is configured to store digital data stream sections of the digital data stream into each one of the memory segments, and a trigger unit coupled to the segmented memory, wherein the trigger unit is configured to create a trigger output signal based on a trigger condition definition and the digital data stream stored in each one of the single memory segments. Further, the present disclosure provides a respective method.

19 Claims, 12 Drawing Sheets

(51) Int. Cl.
*H03M 1/12* (2006.01)
*H03M 1/46* (2006.01)

(58) Field of Classification Search
USPC ......................... 341/120, 141–142, 155, 165
See application file for complete search history.

(56) References Cited

U.S. PATENT DOCUMENTS

| | | | | |
|---|---|---|---|---|
| 6,181,268 | B1 * | 1/2001 | Miyake | H03M 1/46 341/161 |
| 6,486,809 | B1 * | 11/2002 | Figoli | H03M 1/1225 341/155 |
| 7,126,522 | B2 * | 10/2006 | Ogawa | H03M 1/1225 341/155 |
| 2005/0285769 | A1 * | 12/2005 | Harada | H03M 1/64 341/155 |
| 2008/0180289 | A1 * | 7/2008 | Su | H03M 1/002 341/120 |
| 2020/0153447 | A1 * | 5/2020 | D'Angelo | H03M 1/1076 |
| 2020/0408814 | A1 * | 12/2020 | Hatani | H01M 10/48 |
| 2021/0270636 | A1 * | 9/2021 | Akahori | H03M 1/12 |

* cited by examiner

MEASUREMENT APPLICATION DEVICE AND METHOD

TECHNICAL FIELD

The disclosure relates to a measurement application device and a respective method.

BACKGROUND

Although applicable to any type of measurement application device, the present disclosure will mainly be described in conjunction with oscilloscopes.

In oscilloscopes incoming measurement data is usually stored in a ring-buffer-like memory that is continuously filled with measurement data. Further, complex triggering systems may be provided that operate on the data in such a memory. These triggering systems may perform complex computations for determining if a trigger condition is met.

There is a need for improving data processing in measurement application devices.

SUMMARY

The above stated problem is solved by the features of the independent claims. It is understood, that independent claims of a claim category may be formed in analogy to the dependent claims of another claim category.

Accordingly, it is provided:

A measurement application device comprising a measurement interface configured to receive an analog measurement signal, an analog-to-digital converter coupled to the measurement interface, wherein the analog-to-digital converter is configured to convert the analog measurement signal into a digital data stream, a segmented memory coupled to the analog-to-digital converter, wherein the segmented memory comprises a plurality of memory segments and is configured to store digital data stream sections of the digital data stream into each one of the memory segments, and a trigger unit coupled to the segmented memory, wherein the trigger unit is configured to create a trigger output signal based on a trigger condition definition and the digital data stream sections stored in each one of the single memory segments.

Further, it is provided:

A method for operating a measurement application device, the method comprising receiving an analog measurement signal, converting the analog measurement signal into a digital data stream, storing digital data stream sections of the digital data stream into each one of a plurality of memory segments of a memory, especially of the measurement application device, and creating a trigger output signal based on a trigger condition definition and the digital data stream sections stored in each one of the single memory segments.

The present disclosure is based on the finding that common storage and triggering of measurement data in oscilloscopes wastes memory storage space and performs complex computations for determining trigger events.

For example, all segments of an incoming signal are usually stored in the memory, no matter if a trigger event is present or not. Thus, less total memory is available for the actually interesting data in such systems.

The present disclosure, therefore, provides the measurement application device that comprises a measurement interface that is coupled to an analog-to-digital converter. The analog-to-digital converter is coupled to a segmented memory that is coupled to a trigger unit.

During operation of the measurement application device, the measurement interface receives an analog measurement signal, the analog-to-digital converter converts the analog measurement signal into a digital data stream, the segmented memory comprises a plurality of memory segments and stores digital data stream sections of the digital data stream into each one of the memory segments, and the trigger unit creates a trigger output signal based on a trigger condition definition and the digital data stream stored in each one of the single memory segments.

In embodiments, at least some of the elements i.e., of the measurement interface, the analog-to-digital converter, the segmented memory, and the trigger unit, may be provided in a so-called front-end of the measurement application device. Of course, the elements may also be provided in any other section or element of the measurement application device.

The analog measurement signal may comprise any type of signal that may be provided form a device under test, also called DUT, or any other measurement application device. The digital data stream may be a digital representation of the analog measurement signal comprising a specific sample rate and a specific bit depth. Any adequate sample rate, and bit depth may be chosen for the digital data stream. The digital data stream sections each comprise a section of a predetermined length of the digital data stream. Consecutive digital data stream sections refer to consecutive data of the digital data stream. The trigger output signal may comprise any type of signal that may internally be used by any one of the elements of the measurement application device, and that may in embodiments be output by a respective output port of the measurement application device.

A measurement application device according to the present disclosure may comprise any device that may be used in a measurement application to acquire an input signal or to generate an output signal, or to perform additional or supporting functions in a measurement application. A measurement application device may also comprise or be implemented as program application or program applications, also called measurement program application or measurement program applications, that may be executed on a computer device and that may communicate with other measurement application devices in order to perform a measurement task. A measurement application, also called measurement setup, may e.g., comprise at least one or multiple different measurement application devices for performing electric, magnetic, or electromagnetic measurements, especially on single devices under test. Such electric, magnetic, or electromagnetic measurements may e.g., be performed in a measurement laboratory or in a production facility in the respective production line. An exemplary measurement application or measurement setup may serve to qualify the single devices under test i.e., to determine the proper electrical operation of the respective devices under test.

Measurement application devices to this end may comprise at least one signal acquisition section for acquiring electric, magnetic, or electromagnetic signals to be measured from a device under test, or at least one signal generation section for generating electric, magnetic, or electromagnetic signals that may be provided to the device under test. Such a signal acquisition section may comprise, but is not limited to, a front-end for acquiring, filtering, and attenuating or amplifying electrical signals. The signal generation section may comprise, but is not limited to, respective signal generators, amplifiers, and filters. In embodiments, the signal acquisition is performed via the signal acquisition section in a wired or contact-based manner or fashion. To this end, a respective measurement probe may be coupled to the measurement application device via a respective cable. In embodiments, the signal generation and emission is performed via the signal generation section in a wired or contact-based manner or fashion. To this end, a respective signal output probe may be coupled to the measurement application device via a respective cable, or the signal may be output directly via the cable e.g., to a device under test.

Further, when acquiring signals, measurement application devices may comprise a signal processing section that may process the acquired signals. Processing may comprise converting the acquired signals from analog to digital signals, and any other type of digital signal processing, for example, converting signals from the time-domain into the frequency-domain.

The measurement application devices may also comprise a user interface to display the acquired signals to a user and allow a user to control the measurement application devices. Of course, a housing may be provided that comprises the elements of the measurement application device. It is understood, that further elements, like power supply circuitry, and communication interfaces may be provided.

A measurement application device may be a stand-alone device that may be operated without any further element in a measurement application to perform tests on a device under test. Of course, communication capabilities may also be provided for the measurement application device to interact with other measurement application devices.

A measurement application device may comprise, for example, a signal acquisition device e.g., an oscilloscope, especially a digital oscilloscope, a spectrum analyzer, or a vector network analyzer. Such a measurement application device may also comprise a signal generation device e.g., a signal generator, especially an arbitrary signal generator, also called arbitrary waveform generator, or a vector signal generator. Further possible measurement application devices comprise devices like calibration standards, or measurement probe tips.

Of course, at least some of the possible functions, like signal acquisition and signal generation, may be combined in a single measurement application device.

In embodiments, the measurement application device may comprise pure data acquisition devices that are capable of acquiring an input signal and of providing the acquired input signal as digital input signal to a respective data storage or application server. Such pure data acquisition devices not necessarily comprise a user interface or display. Instead, such pure data acquisition devices may be controlled remotely e.g., via a respective data interface, like a network interface or a USB interface. The same applies to pure signal generation devices that may generate an output signal without comprising any user interface or configuration input elements. Instead, such signal generation devices may be operated remotely via a data connection.

The measurement application device according to the present disclosure provides a base setup to perform effective triggering and memory management of the segmented memory, also called acquisition memory in the context of measurement application devices.

Further embodiments of the present disclosure are subject of the further dependent claims and of the following description, referring to the drawings.

In the following, the dependent claims referring directly or indirectly to claim 1 are described in more detail. For the avoidance of doubt, the features of the dependent claims relating to independent claim 1 can be combined in all variations with each other and the disclosure of the description is not limited to the claim dependencies as specified in the claim set. Further, the features of the dependent claims referring to independent claim 1 may be combined with any of the features of the other independent claims or the dependent claims relating to any one of the other independent claims. In a respective method, respective method steps may perform the function of the respective apparatus elements, and in a respective apparatus, respective apparatus elements may perform the respective method steps.

In an embodiment, which can be combined with all other embodiments mentioned above or below, the segmented memory may comprise a memory, and a memory controller coupled to the memory, wherein the memory controller may be configured to organize the memory into the memory segments and to control storing the digital data stream sections in the memory segments.

The memory may be any type of data memory. Since the digital data stream may arrive at the memory at a high data rate, the memory may comprise e.g., a RAM memory.

The memory controller is coupled to or implemented in the memory, and serves to segment the memory into single memory segments. The segmentation of the memory may be a virtual or logical segmentation. In such embodiments, the memory provides a single large memory space that is segmented only by the logic implemented in the memory controller.

In other embodiments, the memory may comprise a hardware memory for each segment, and the memory controller may be coupled to each hardware memory and control access to the memories.

The memory controller may receive the digital data stream, and distribute or store the incoming data in the respective memory segment. In embodiments, the memory controller may control a switch or set a memory destination that leads to storing of the digital data stream sections in the respective segments.

In another embodiment, which can be combined with all other embodiments mentioned above or below, the memory controller may be further configured to exclude a respective first memory segment from storing further digital data stream sections if a positive trigger output signal is provided by the trigger unit for the digital data stream section that is stored in the first memory segment.

Conventional oscilloscopes usually store the full incoming digital data stream in the acquisition memory. In contrast, with the segmented memory of the measurement application device, it is possible to store and keep only the required digital data stream sections that actually fulfill the respective trigger condition definition.

By excluding the memory segments that comprise digital data stream sections that fulfill the trigger condition definition from writing further data to those sections, the relevant memory segments may be provided with a kind of write protection.

In a further embodiment, which can be combined with all other embodiments mentioned above or below, the memory controller may be further configured to exclude a further respective second memory segment that comprises a digital data stream section that is directly consecutive to the digital data stream section stored in the first memory segment from storing further digital data stream sections if a positive trigger output signal is provided by the trigger unit for the digital data stream section stored in the first memory segment.

The term “positive trigger signal” refers to the trigger unit identifying a match between the trigger condition definition and the data stored in the respective first memory segment. In contrast, a negative trigger signal indicates that no match was detected between the data in the memory segment, and the trigger condition definition.

If a first memory segment is excluded from further writing or storing of data, the trigger may still have occurred for data that is stored at the end of the respective first memory segment. Consequently, a second memory segment that directly follows the first memory segment may also be excluded from writing new data.

This allows later viewing sections of the waveform of the analog measurement signal before and after the trigger event.

In an embodiment, which can be combined with all other embodiments mentioned above or below, the memory controller may be further configured to overwrite a memory segment when storing the digital data stream if a negative trigger output signal is provided by the trigger unit for the digital data stream section that is stored in the respective memory segment.

In contrast to the above explanations, if a negative trigger output signal is provided by the trigger unit for a respective memory segment, this segment may be marked for overwriting. This means that new data e.g., a further digital data stream section, may be written to that memory segment.

In a further embodiment, which can be combined with all other embodiments mentioned above or below, the memory controller may be further configured to at least one of instantaneously overwrite the respective memory segment with a further digital data stream section if a negative trigger output signal is provided by the trigger unit, or to mark the respective memory segment for overwriting with a further digital data stream section if a negative trigger output signal is provided by the trigger unit, and write the next further digital data stream section into a consecutive memory segment that is not excluded from storing.

If a memory segment is marked for overwriting with new data, this memory segment may instantaneously be overwritten with a respective digital data stream section. This means that the memory segment is reused prior to writing any data to other memory segments.

In other embodiments, the respective memory segment may be marked for overwriting, as other memory segments may be marked as excluded for writing further data into the memory segments. However, prior to rewriting the specific memory segment, data may be written into other memory segments.

In both variants, the segmented memory may operate like a ring-buffer type of memory. However, in the first variant, data is written to single memory segments until a positive trigger output signal is provided for the digital data stream section in the memory segment.

In the second variant, after writing data to one memory segment, the other memory segments of the ring-buffer type of memory are first written. This provides more time to operate on the memory segments, since all other non-blocked memory segments will be written first before writing this memory segment again.

In another embodiment, which can be combined with all other embodiments mentioned above or below, the memory controller may comprise a data input, a data output for each one of the memory segments, and a data switch coupled to the data input, wherein the data switch may be configured to controllably couple the data input to one of the data outputs.

The memory controller may be implemented as firmware or software that is executed in a processing device, an ASIC, an FPGA or the like. In other embodiments, the memory controller may comprise the above-described hardware layout with the data input, and a data output for each one of the memory segments. The data switch may then be controllably coupled the data input to any one of the outputs, in order to write data to the specific memory segment.

In an embodiment, which can be combined with all other embodiments mentioned above or below, the trigger unit may comprise at least one comparator configured to consecutively compare, for the one of the memory segments that data was last stored in, the digital data stream section stored in the respective memory segment with at least one predefined trigger zone definition, output a positive trigger output signal if the digital data stream section stored in the respective memory segment matches with the at least one predefined trigger zone definition, and output a negative trigger output signal if the digital data stream section stored in the respective memory segment does not match with the at least one predefined trigger zone definition.

The comparator of the trigger unit may be a zone-based comparator that may operate on the at least one predefined trigger zone definition. The term “trigger zone definition” refers to the definition of a graphical or geometrical zone with regard to the waveform that represents the analog measurement signal.

The trigger zone definitions may be provided as a description of the geometry of the respective zone in a coordinate system that accommodates the waveform that represents the analog measurement signal. Such a zone may be drawn by a user e.g., on a screen of the measurement application device, especially while the screen is showing the waveform.

The comparator may then use the at least one trigger zone definition and compare the trigger zone definition with the respective waveform of the analog measurement signal for a respective digital data stream sections.

As will be described in more detail below, a trigger zone definition may also comprise a function that the comparator may use to determine if a trigger is matched or not. A simple version of such a function my be a “is in” or “is not in” function. With an “is in” function, the trigger zone definition may be matched by an analog measurement signal if the waveform has at least a signal component within the defined zone. In case of a “is not in” function, the trigger zone definition may be matched by an analog measurement signal if the waveform does not have any signal component within the defined zone.

The terms “positive trigger output signal”, and “negative trigger output signal” refer to logical signals, which imply a respective content, they do not need to, but may, be represented by e.g., a binary signal with signal levels of 0 (negative), and 1 (positive) to be provided.

In a further embodiment, which can be combined with all other embodiments mentioned above or below, the trigger unit further may comprise at least one pixel converter that may be coupled to the at least one comparator, wherein the at least one pixel converter may be configured to convert incoming ones of the digital data stream sections into a pixel-based image and provide the pixel-based image to the at least one comparator, wherein the at least one comparator may be configured to compare the pixel-based image with the at least one predefined trigger zone definition to determine the trigger output signal.

The pixel converter may convert a waveform image that may be generated based on the analog measurement signal into a kind of intensity image. The intensity image may be a binary image comprising only black and white pixels. In such a binary intensity image either a white or a black pixel may represent a pixel with waveform content present in the waveform image. The intensity image may also comprise a heat-map-like image. In such an intensity image, a gradient or scale may be defined from a minimum intensity value to a maximum intensity value. When displaying such an intensity image a color gradient may be defined for e.g., the signal intensity. With such an intensity image, the color of each pixel may refer to the signal strength of the analog measurement signal, and the position of the pixel may refer to the position of the waveform content or signal value.

It is also possible to use two analog measurement signals for an XY representation.

The comparator may compare the intensity image pixel by pixel with the at least one trigger zone definition, and determine if a respective signal content is within the trigger zone or not, and if it meets the triggering criteria.

In another embodiment, which can be combined with all other embodiments mentioned above or below, the at least one predefined trigger zone definition may comprise at least one of a definition of a geometric zone in a coordinate system corresponding to the pixel-based image, a threshold value, and a comparator function.

The geometric zone, as explained above, may define the geometry or shape of a trigger zone with regard to a coordinate system or image of the waveform formed by the analog measurement signal.

The threshold value may be a value between the maximum and minimum value that each one of the pixels in the intensity image may comprise. With a binary intensity image, the threshold value may be 1 or 0. With a heat-map-like image, the threshold value may be between the highest and the lowest intensity value.

The comparator function defines how the comparator should compare the values of the single pixels in the intensity image with the signal values of the waveform representation of the analog measurement signal. Details of possible comparator functions will be explained below.

In an embodiment, which can be combined with all other embodiments mentioned above or below, the comparator function may comprise one of a higher-than function, a lower-than function, an is-equal function, and a is-not-equal function.

A higher-than function may define a threshold value, and the comparator may detect a matched trigger if the value of a respective pixel in the intensity image is higher than the threshold value.

A lower-than function may define a threshold value, and the comparator may detect a matched trigger if the value of a respective pixel in the intensity image is lower than the threshold value.

An is-equal function may define a threshold value, and the comparator may detect a matched trigger if the value of a respective pixel in the intensity image is equal to the threshold value.

An is-not-equal function may define a threshold value, and the comparator may detect a matched trigger if the value of a respective pixel in the intensity image is different than the threshold value.

In a further embodiment, which can be combined with all other embodiments mentioned above or below, the measurement application device may comprise at least two comparators, and may further comprise a trigger output signal comparator coupled to the at least two comparators, wherein the trigger output signal comparator may be configured to generate a unified trigger output signal based on a predetermined logical combination of the trigger output signals provided by the single comparators.

With two or more comparators, the trigger output signal comparator may combine the trigger output signals of the single comparators based on specific logic functions for each one of the comparators.

For example, the trigger output signal comparator may combine the outputs of the single comparators with a logic AND function, or a logic OR function. In embodiments, the trigger output signal comparator may also comprise a respective negator for single ones of the trigger output signals. For example, a first trigger output signal may be negated and a second trigger output signal may not be negated prior to combining the trigger output signals with an AND or an OR function.

The unified trigger output signal may then be used instead of the single trigger output signals, to determine if a memory segment is to be excluded from further writing of data or not.

Generally, any processing element, like the comparator, the trigger output signal comparator, the memory controller, or any other element described herein as comprising a function that may be implemented in a programmable device, may comprise or may be provided in or as part of at least one of a dedicated processing element e.g., a processing unit, a microcontroller, a field programmable gate array, FPGA, a complex programmable logic device, CPLD, an application specific integrated circuit, ASIC, or the like. Further, a respective program or configuration may be provided to implement the required functionality. Such an element may at least in part also be provided as a non-transitory computer program product comprising computer readable instructions that may be executed by a processing element. In a further embodiment, the element may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry and clock generation circuitry.

Generally, any computer program or computer program product disclosed herein is to be understood as a non-transitory computer program product.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
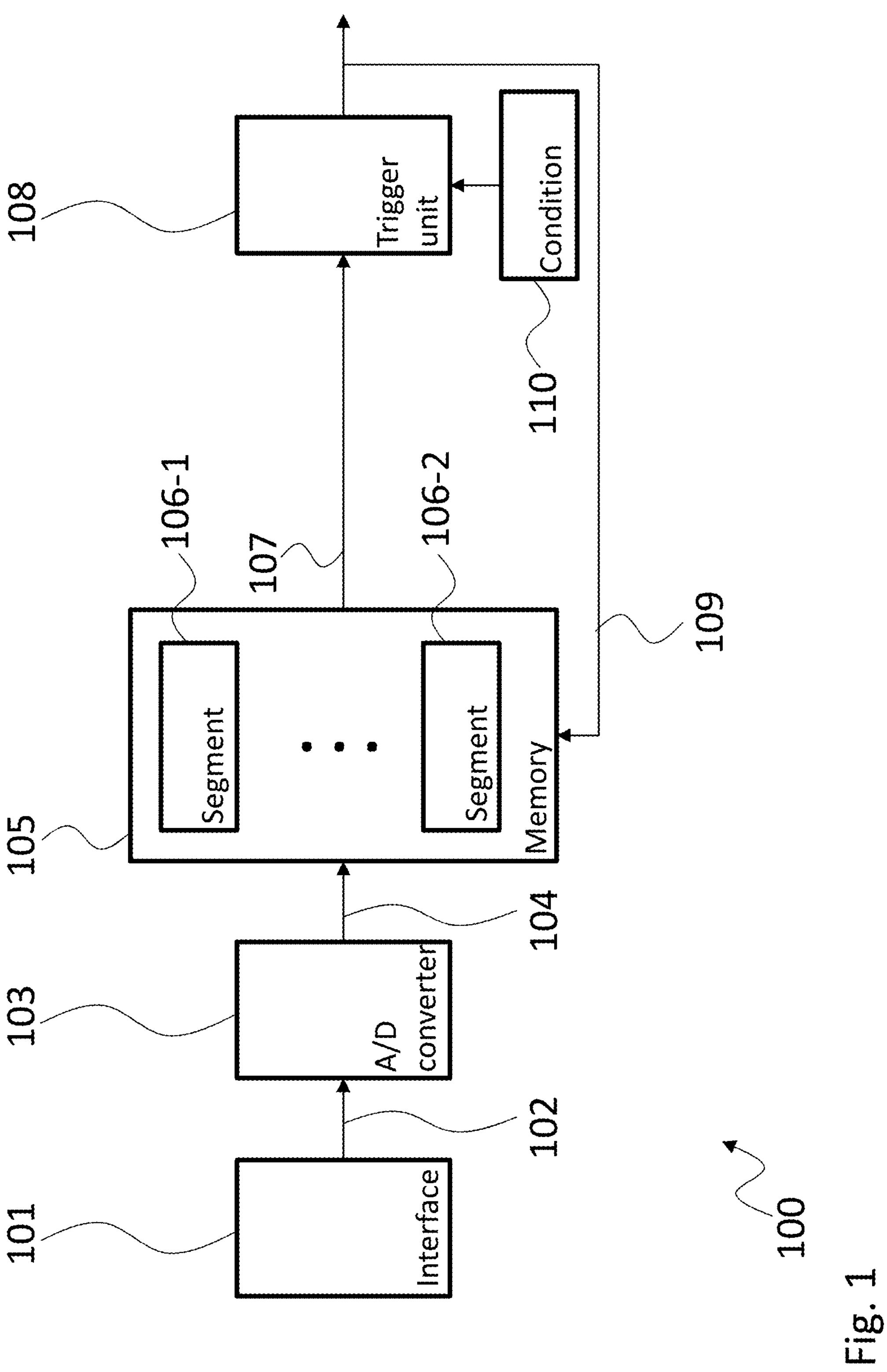
FIG. 1 shows a block diagram of an embodiment of a measurement application device according to the present disclosure.

FIG. 1 shows a block diagram of a measurement application device 100. The measurement application device 100 comprises a measurement interface 101 that is coupled to analog-to-digital converter 103. The analog-to-digital converter 103 is coupled to segmented memory 105 that is coupled to a trigger unit 108.

The measurement interface 101 receives an analog measurement signal 102, and provides the analog measurement signal 102 to the analog-to-digital converter 103. The analog-to-digital converter 103 converts the analog measurement signal 102 into a digital data stream 104 and provides digital data stream 104 to the segmented memory 105. The segmented memory 105 comprises a plurality of memory segments 106-1, 106-2, wherein only two are show, but more possible memory segments are hinted at by three dots. The segmented memory 105 stores digital data stream sections 107 of the digital data stream 104 into each one of the memory segments 106-1, 106-2. The trigger unit 108 consecutively receives the digital data stream sections 107 and creates a trigger output signal 109 based on a trigger condition definition 110 and the digital data stream section 107 stored in each one of the single memory segments 106-1, 106-2.

Although not explicitly shown, further elements may be provided in the measurement application device 100. For example, a preprocessor for preprocessing the digital data stream 104 may be provided between the analog-to-digital converter 103, and the segmented memory 105. Such a preprocessor may e.g., decimate or condition the digital data stream 104. As additional or alternative example, a postprocessor for processing the digital data stream sections 107 prior to providing the digital data stream sections 107 to the trigger unit 108 may be provided. Such a postprocessor may e.g., apply mathematical functions or formulas to the digital data stream sections 107, or convert the digital data stream sections 107 from the time domain into the frequency domain.

Figure 2:
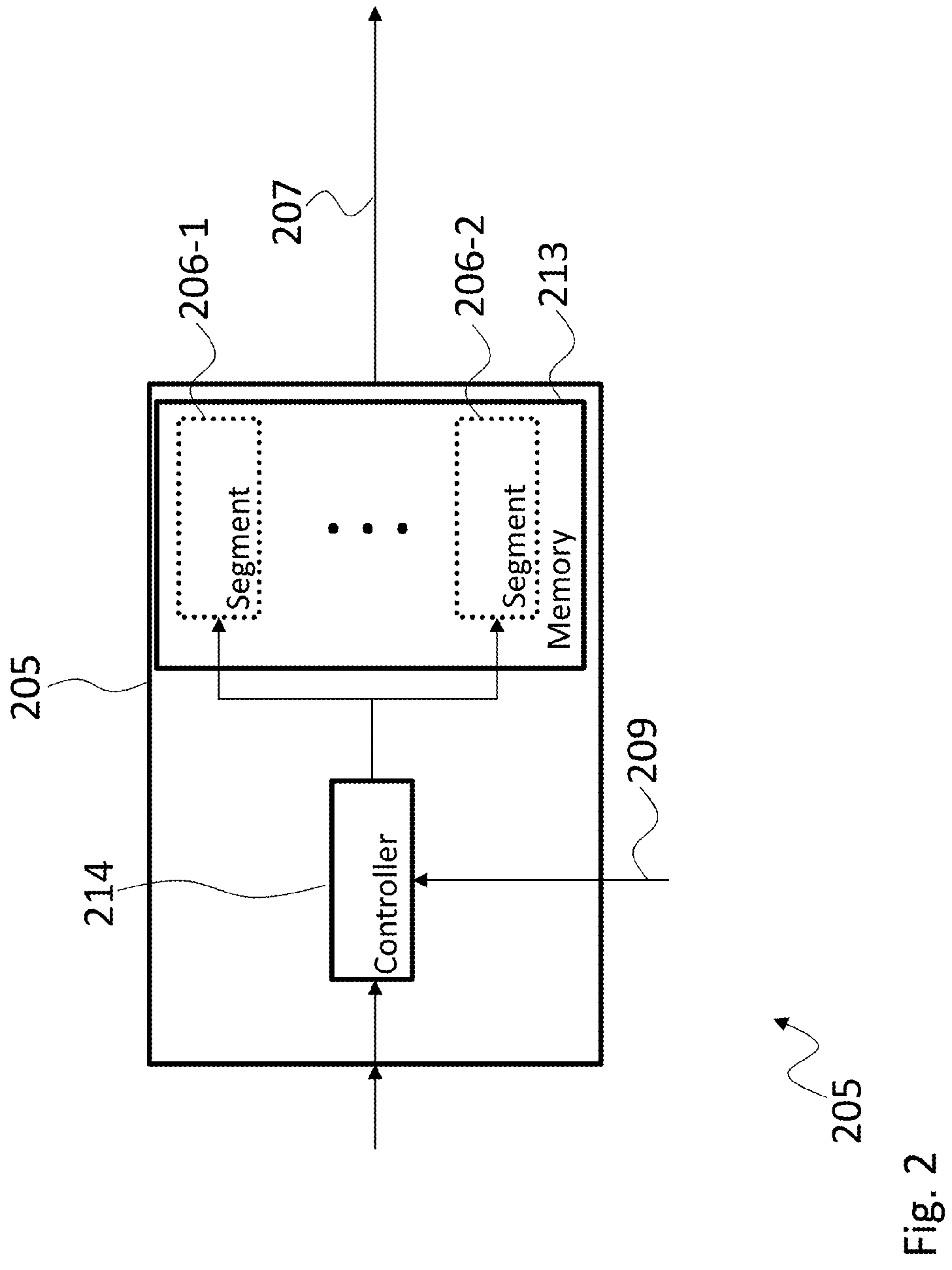
FIG. 2 shows a block diagram of an embodiment of a segmented memory for use with a measurement application device according to the present disclosure.

FIG. 2 shows a block diagram of a segmented memory 205 for use with any one of the embodiments of the measurement application device disclosed herein. The segmented memory 205 comprises a memory 213, and a memory controller 214 that is coupled to the memory 213.

The memory controller 214 organizes the memory 213 into the memory segments 206-1, 206-2 and controls the process of storing the digital data stream sections in the memory segments 206-1, 206-2 using the trigger output signal 209.

The memory controller 214 may exclude a respective first memory segment 206-1 from storing further digital data stream sections if a positive trigger output signal 209 is provided by the trigger unit for the digital data stream section that is stored in the first memory segment. The memory controller 214 may in embodiments further exclude a further respective second memory segment that comprises a digital data stream section that is directly consecutive to the digital data stream section stored in the first memory segment 206-1 from storing further digital data stream sections if a positive trigger output signal 209 is provided by the trigger unit for the digital data stream section stored in the first memory segment.

The memory controller 214 may overwrite a memory segment 206-1, 206-2 when storing the digital data stream sections if a negative trigger output signal 209 is provided by the trigger unit for the digital data stream section that is stored in the respective memory segment 206-1, 206-2. The memory controller 214 may instantaneously overwrite the respective memory segment 206-1, 206-2 with a further digital data stream section if a negative trigger output signal 209 is provided by the trigger unit. Alternatively, the memory controller 214 may mark the respective memory segment 206-1, 206-2 for overwriting with a further digital data stream section if a negative trigger output signal 209 is provided by the trigger unit, and write the next further digital data stream section into a consecutive memory segment 206-1, 206-2 that is not excluded from storing.

Figure 3:
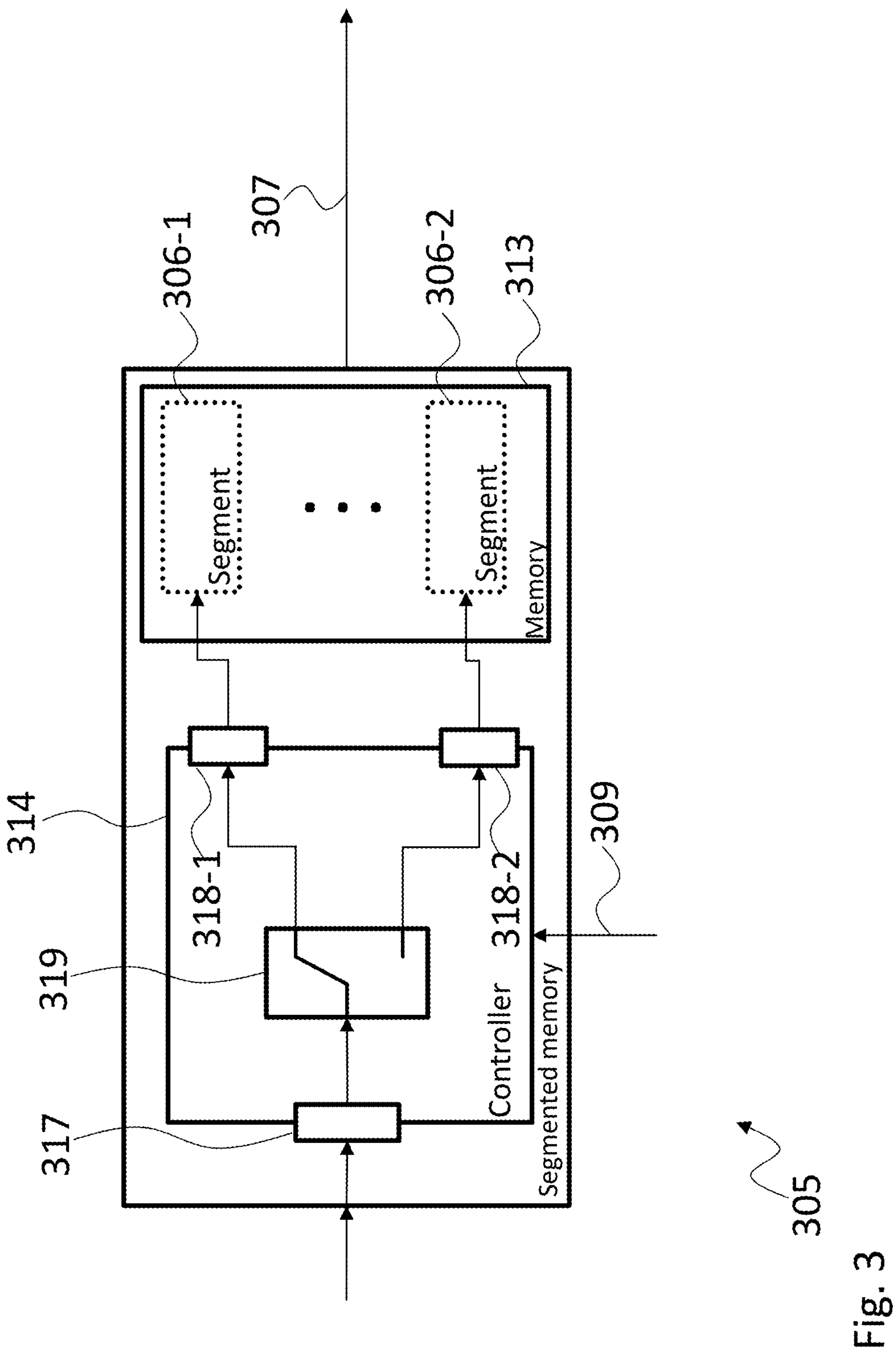
FIG. 3 shows a block diagram of another embodiment of a segmented memory for use with a measurement application device according to the present disclosure.

FIG. 3 shows a block diagram of segmented memory 305. The segmented memory 305 is based on the segmented memory 205. Therefore, the segmented memory 305 comprises a memory 313, and a memory controller 314 that is coupled to the memory 313. The memory controller 314 organizes the memory 313 into the memory segments 306-1, 306-2 and controls the process of storing the digital data stream sections in the memory segments 306-1, 306-2 using the trigger output signal 309. The explanations provided herein for any one of the embodiments of the segmented memory also apply to segmented memory 305.

Further, the memory controller 314 comprises a data input 317 that is coupled to a data switch 319. The data switch 319 is coupled to a plurality of data outputs 318-1, 318-2, wherein one data output 318-1, 318-2 may be provided for each one of the memory segments 306-1, 306-2 in memory 313.

The data input 317 receives the digital data stream, and provides the digital data stream to the data switch 319. The data switch 319 controllably couples the data input 317 to one of the data outputs 318-1, 318-2.

In embodiments, the data outputs 318-1, 318-2 may comprise hardware interfaces for each one of the memory segments 306-1, 306-2.

In further embodiments, the data switch 319, and the data outputs 318-1, 318-2 may at least in part be logic elements, wherein the data switch 319 may determine an address of a respective one of the memory segments 306-1, 306-2. The data outputs 318-1, 318-2 may refer to the data switch 319 setting the determined address on a data interface between the memory controller 314, and the memory 313.

Figure 4:
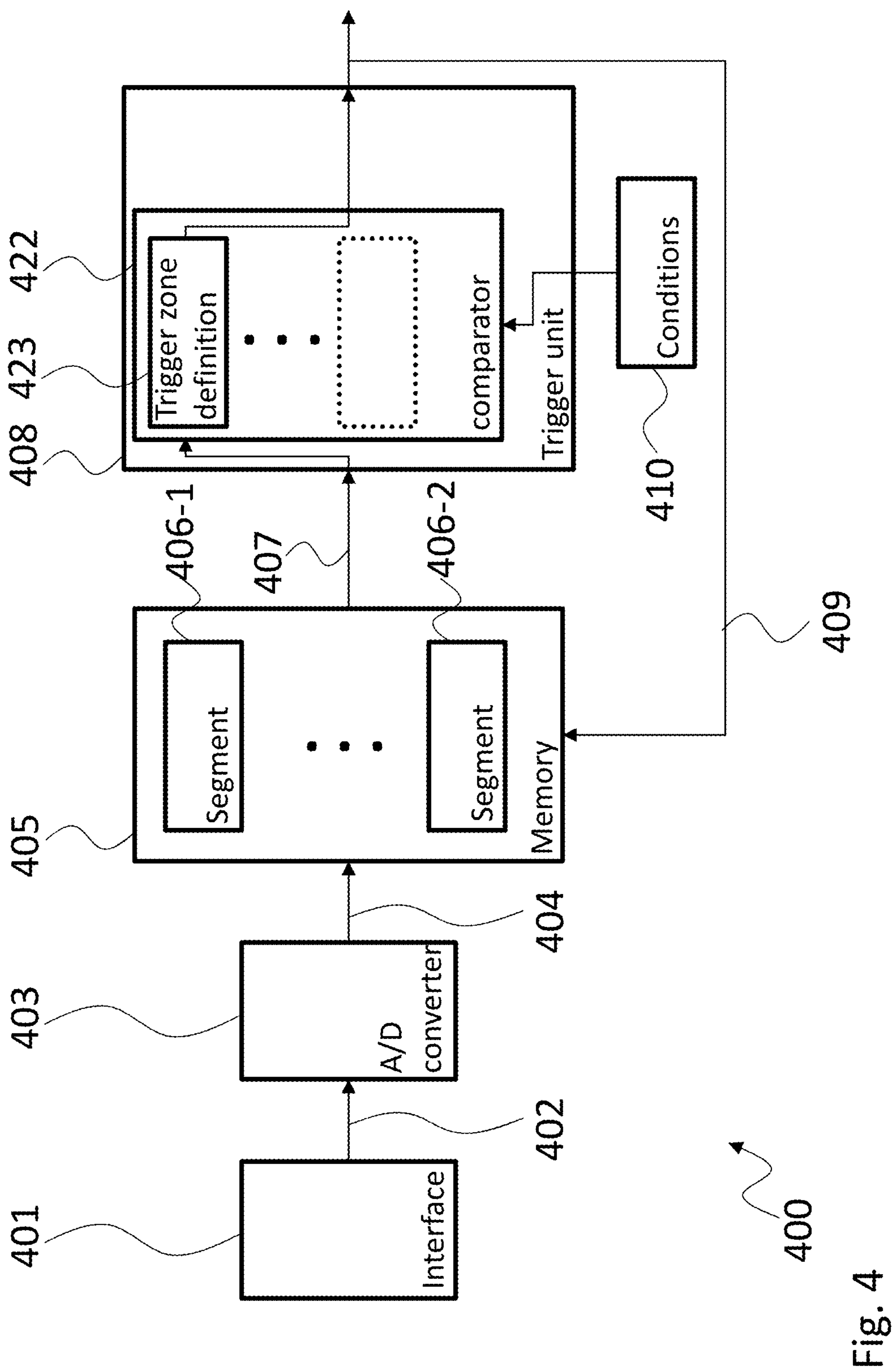
FIG. 4 shows a block diagram of a further embodiment of a measurement application device according to the present disclosure.

FIG. 4 shows a block diagram of a measurement application device 400. The measurement application device 400 is based on the measurement application device 100. Therefore, the measurement application device 400 comprises a measurement interface 401 that is coupled to analog-to-digital converter 403. The analog-to-digital converter 403 is coupled to segmented memory 405 that is coupled to a trigger unit 408. measurement interface 401 receives an analog measurement signal 402, and provides the analog measurement signal 402 to the analog-to-digital converter 403. The analog-to-digital converter 403 converts the analog measurement signal 402 into a digital data stream 404 and provides digital data stream 404 to the segmented memory 405. The segmented memory 405 comprises a plurality of memory segments 406-1, 406-2, wherein only two are show, but more possible memory segments are hinted at by three dots. The segmented memory 405 stores digital data stream sections 407 of the digital data stream 404 into each one of the memory segments 406-1, 406-2. The trigger unit 408 consecutively receives the digital data stream sections 407 and creates a trigger output signal 409 based on a trigger condition definition 410 and the digital data stream section 407 stored in each one of the single memory segments 406-1, 406-2. The explanations provided herein for any one of the embodiments of the measurement application device apply mutatis mutandis to the measurement application device 400.

In the measurement application device 400, the trigger unit 408 comprises a comparator 422. The comparator 422 receives the trigger condition definition 410 for the comparator 422.

The trigger condition definition 410 may comprise a plurality of trigger zone definitions 423 that the comparator 422 may use to determine the trigger output signal 409.

The comparator 422 may consecutively compare, for the one of the memory segments 406-1, 406-2 that data was last stored in, the digital data stream section 407 stored in the respective memory segment 406-1, 406-2 with each one of the trigger zone definitions 423.

The comparator 422 may output a positive trigger output signal 409 if the digital data stream section 407 stored in the respective memory segment 206-1, 206-2 matches the respective trigger zone definitions 423, or a negative trigger output signal 409 otherwise.

As explained above, the trigger zone definitions 423 each may define a geometric zone or area with regard to the waveform that represents the analog measurement signal 402. Multiple such trigger zone definitions 423 may be combined by the comparator 422 to form a single trigger output signal 409. For combining the results regarding the single trigger zone definitions 423, the trigger zone definitions 423 may comprise a logic function, like a AND or NOT function. The final trigger output signal 409 may be formed by combining the single results regarding the single trigger zone definitions 423 according to these logic functions.

Figure 5:
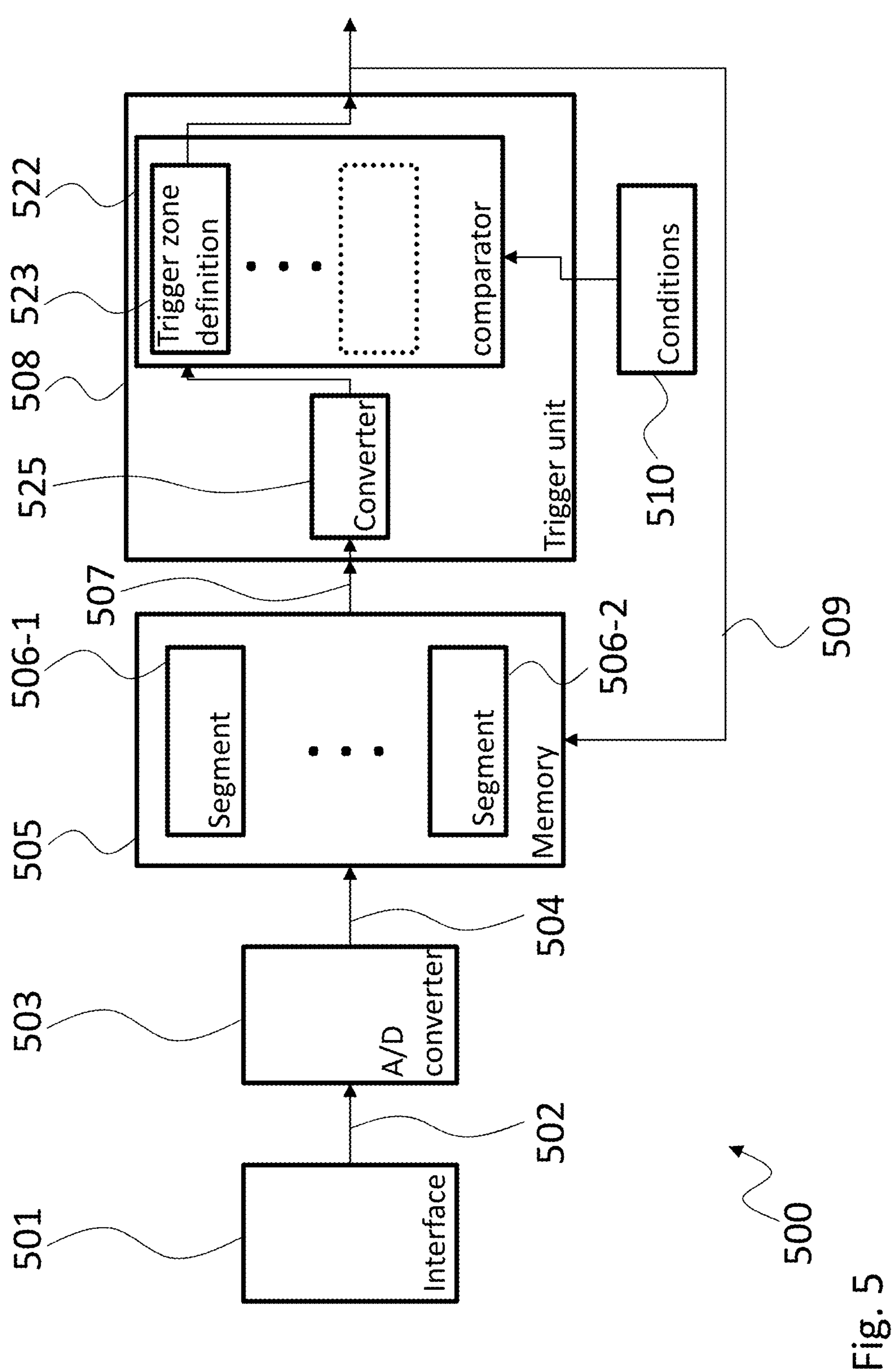
FIG. 5 shows a block diagram of another embodiment of a measurement application device according to the present disclosure.

FIG. 5 shows a block diagram of a measurement application device 500. The measurement application device 500 is based on the measurement application device 400. Therefore, the measurement application device 500 comprises a measurement interface 501 that is coupled to analog-to-digital converter 503. The analog-to-digital converter 503 is coupled to segmented memory 505 that is coupled to a trigger unit 508. measurement interface 501 receives an analog measurement signal 502, and provides the analog measurement signal 502 to the analog-to-digital converter 503. The analog-to-digital converter 503 converts the analog measurement signal 502 into a digital data stream 504 and provides digital data stream 504 to the segmented memory 505. The segmented memory 505 comprises a plurality of memory segments 506-1, 506-2, wherein only two are show, but more possible memory segments are hinted at by three dots. The segmented memory 505 stores digital data stream sections 507 of the digital data stream 504 into each one of the memory segments 506-1, 506-2. The trigger unit 508 consecutively receives the digital data stream sections 507 and creates a trigger output signal 509 based on a trigger condition definition 510 and the digital data stream section 507 stored in each one of the single memory segments 506-1, 506-2. The trigger unit 508 comprises a comparator 522. The comparator 522 receives the trigger condition definition 510 for the comparator 522. The explanations provided herein for any one of the embodiments of the measurement application device apply mutatis mutandis to the measurement application device 500.

In the measurement application device 500, the trigger unit 508 further comprises at least one pixel converter 525 that is coupled to the at least one comparator 522. The at least one pixel converter 525 converts incoming ones of the digital data stream sections 507 into a pixel-based image and provide the pixel-based image to the at least one comparator 522. The at least one comparator compares the pixel-based image with the at least one predefined trigger zone definition 523 to determine the trigger output signal 509.

The predefined trigger zone definitions may each comprise at least one of a definition of a geometric zone in a coordinate system corresponding to the pixel-based image, a threshold value, a comparator function.

The comparator functions may comprise one of a higher-than function, a lower-than function, an is-equal function, and an is-not-equal function.

Figure 6:
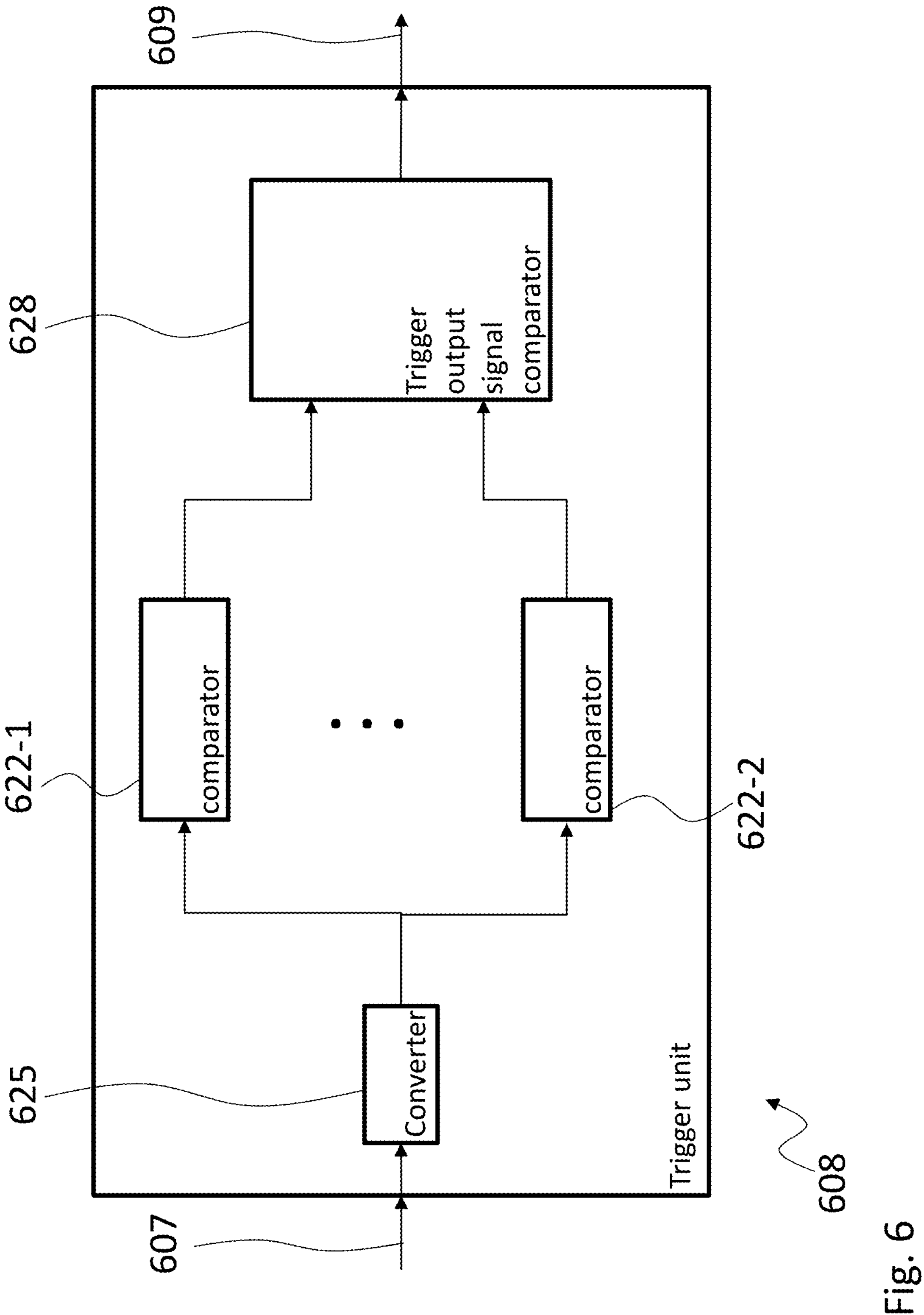
FIG. 6 shows a block diagram of an embodiment of a trigger unit for use with a measurement application device according to the present disclosure.

FIG. 6 shows a block diagram of an embodiment of a trigger unit 608 for use with any one of the embodiments of the measurement application device disclosed herein. The trigger unit 608 optionally comprises the pixel converter 625 that is coupled not only to one, but to multiple comparators 622-1, 622-2. While two comparators 622-1, 622-2 are shown, more comparators are hinted at by three dots. Further, multiple pixel converters may be provided for the comparators, instead of only one. Further, the trigger unit 608 comprises a trigger output signal comparator 628 that is coupled to the at least two comparators 622-1, 622-2. The trigger output signal comparator 628 generates a unified trigger output signal 609 based on a predetermined logical combination of the trigger output signals provided by the single comparators 622-1, 622-2. The explanations provided herein for any embodiment of the trigger unit apply mutatis mutandis to trigger unit 608.

Figure 7:
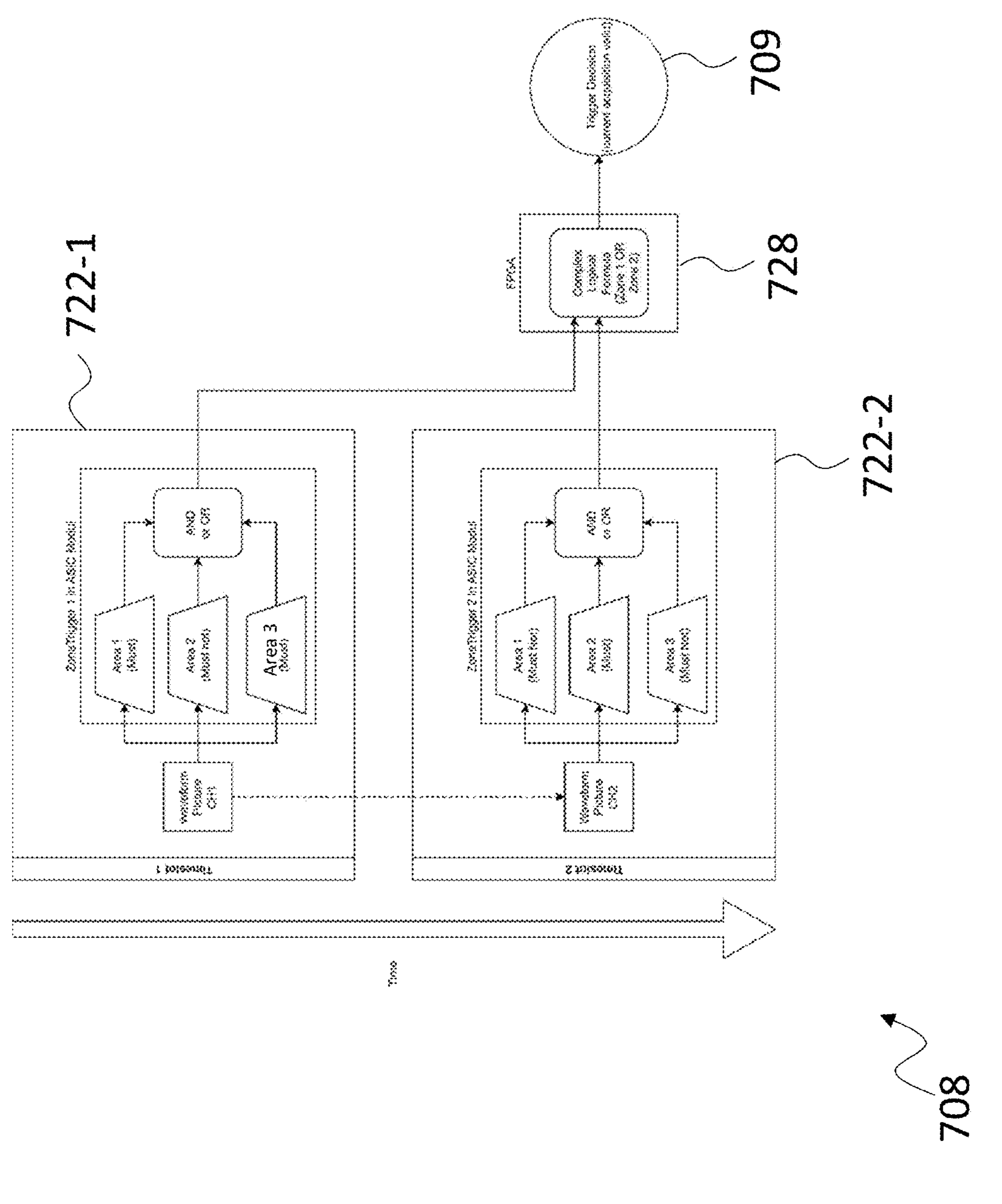
FIG. 7 shows a block diagram of another embodiment of a trigger unit for use with a measurement application device according to the present disclosure.

FIG. 7 shows a block diagram of another trigger unit 708 for use with a measurement application device according to the present disclosure. The explanations provided herein for any embodiment of the trigger unit apply mutatis mutandis to trigger unit 708.

The trigger unit 708 comprises two comparators 722-1, 722-2 that each receive waveform pictures, as they may be provided by a corresponding pixel converter. The comparator 722-1 receives an image for a first channel, and comparator 722-2 receives an image for a second channel.

Each one of the comparators 722-1, 722-2 exemplarily compares the image with three trigger zone definitions, and combines the respective result with logical AND or OR functions. A trigger output signal comparator 728 combines the outputs of the single comparators 722-1, 722-2 to form the trigger output signal 709.

The single trigger zone definitions exemplary comprise a "Must" or "Must not" indication that indicates if a part of the waveform should be "in" or "not in" the respective zone.

Figure 8:
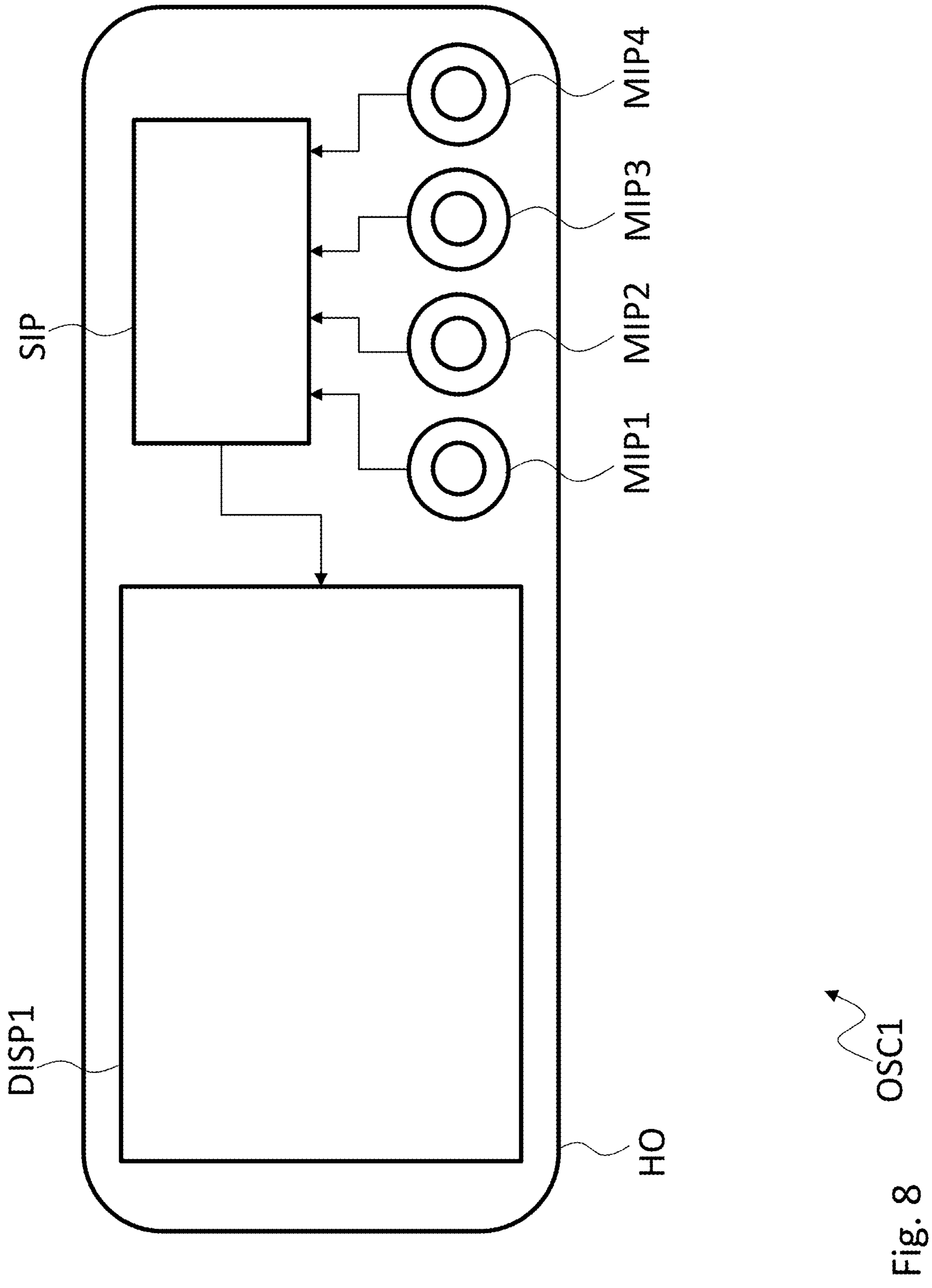
FIG. 8 shows a block diagram of a further embodiment of a measurement application device according to the present disclosure.

FIG. 8 shows a block diagram of an oscilloscope OSC1 that may be an embodiment of a measurement application device according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

Although not explicitly shown, it is understood, that the oscilloscope OSC1 may also comprise signal outputs. Such signal outputs may for example serve to output calibration signals. Such calibration signals allow calibrating the measurement setup prior to performing any measurement. The process of calibrating and correcting any measurement signals based on the calibration may also be called de-embedding and may comprise applying respective algorithms on the measured signals.

In the oscilloscope OSC1 the signal processor SIP or an additional processing element may perform the function of at least the trigger unit according to the present disclosure, or may implement at least some function so the respective method. Of course, a communication interface may be provided in the oscilloscope OSC1 for communication with other measurement application devices.

Figure 9:
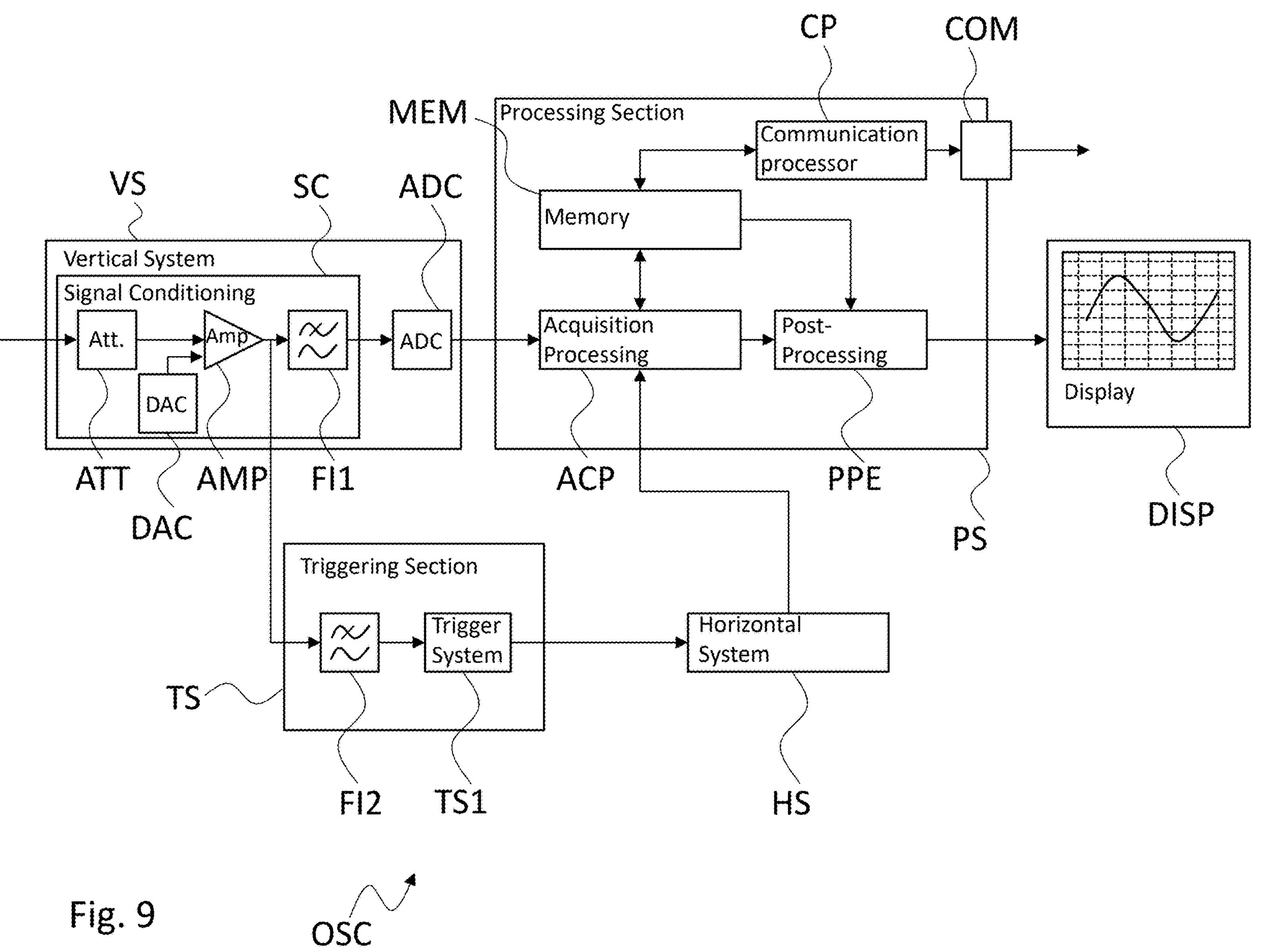
FIG. 9 shows a block diagram of another embodiment of a measurement application device according to the present disclosure.

FIG. 9 shows a block diagram of an oscilloscope OSC that may be an implementation of a measurement application device according to the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS and the display DISP. It is understood, that the partitioning into five general sections is a logical partitioning and does not limit the placement and implementation of any of the elements of the oscilloscope OSC in any way.

The vertical system VS mainly serves for offsetting, attenuating and amplifying a signal to be acquired. The signal may for example be modified to fit in the available space on the display DISP or to comprise a vertical size as configured by a user.

To this end, the vertical system VS comprises a signal conditioning section SC with an attenuator ATT and a digital-to-analog-converter DAC that are coupled to an amplifier AMP. The amplifier AMP is coupled to a filter FI1, which in the shown example is provided as a low pass filter. The vertical system VS also comprises an analog-to-digital converter ADC that receives the output from the filter FI1 and converts the received analog signal into a digital signal.

The attenuator ATT and the amplifier AMP serve to scale the amplitude of the signal to be acquired to match the operation range of the analog-to-digital converter ADC. The digital-to-analog-converter DAC serves to modify the DC component of the input signal to be acquired to match the operation range of the analog-to-digital converter ADC. The filter FI1 serves to filter out unwanted high frequency components of the signal to be acquired.

The triggering section TS operates on the signal as provided by the amplifier AMP. The triggering section TS comprises a filter FI2, which in this embodiment is implemented as a low pass filter. The filter FI2 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

In order to allow an exact matching of the trigger event and the waveform that is shown on the display DISP, a common time base may be provided for the analog-to-digital converter ADC and the trigger system TS1.

It is understood, that although not explicitly shown, the trigger system TS1 may comprise at least one of configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the amplifier AMP but will operate on the digital signal as provided by the analog-to-digital converter ADC.

The above-explained trigger system TS1 may be a common trigger system of an oscilloscope. The segmented memory 605 and the trigger unit may be added to the oscilloscope OSC to implement the measurement application device according to the present disclosure.

A digital triggering section may comprise a processing element, like a processor, a DSP, a CPLD, an ASIC or an FPGA to implement digital algorithms that detect a valid trigger event.

The horizontal system HS is coupled to the output of the trigger system TS1 and mainly serves to position and scale the signal to be acquired horizontally on the display DISP.

The oscilloscope OSC further comprises a processing section PS that implements digital signal processing and data storage for the oscilloscope OSC. The processing section PS comprises an acquisition processing element ACP that is couple to the output of the analog-to-digital converter ADC and the output of the horizontal system HS as well as to a memory MEM and a post processing element PPE.

The acquisition processing element ACP manages the acquisition of digital data from the analog-to-digital converter ADC and the storage of the data in the memory MEM. The acquisition processing element ACP may for example comprise a processing element with a digital interface to the analog-to-digital converter ADC2 and a digital interface to the memory MEM. The processing element may for example comprise a microcontroller, a DSP, a CPLD, an ASIC or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA opposed to software being executed by a processor.

The processing section PS further comprises a communication processor CP and a communication interface COM.

The communication processor CP may be a device that manages data transfer to and from the oscilloscope OSC. The communication interface COM for any adequate communication standard like for example, Ethernet, WIFI, Bluetooth, NFC, an infra-red communication standard, and a visible-light communication standard.

The communication processor CP is coupled to the memory MEM and may use the memory MEM to store and retrieve data.

Of course, the communication processor CP may also be coupled to any other element of the oscilloscope OSC to retrieve device data or to provide device data that is received from the management server.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user. The post processing element PPE may also realize analysis functions like cursors, waveform measurements, histograms, or math functions.

The display DISP controls all aspects of signal representation to a user, although not explicitly shown, may comprise any component that is required to receive data to be displayed and control a display device to display the data as required.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

Figure 10:
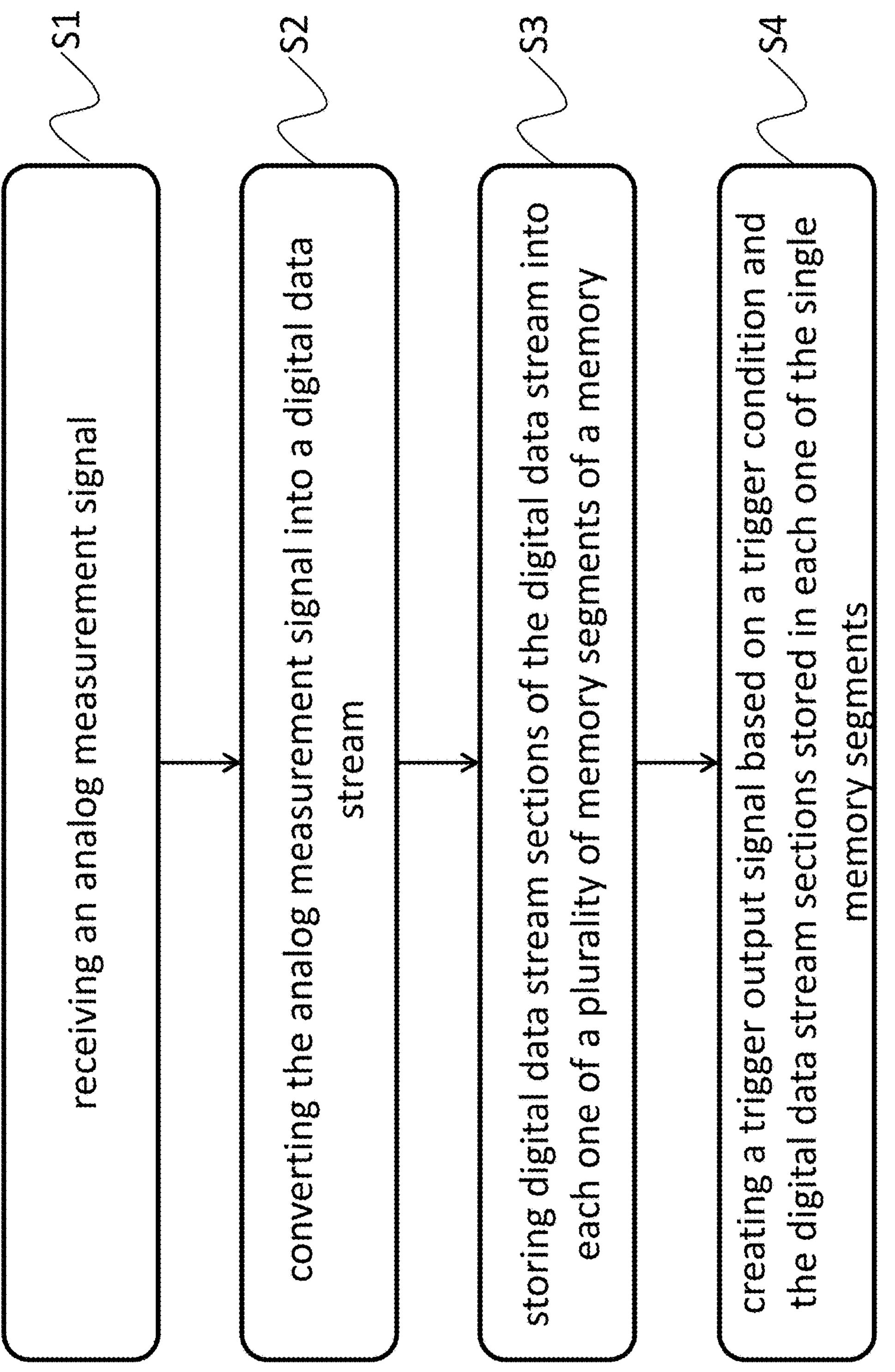
FIG. 10 shows a flow diagram of an embodiment of a method according to the present disclosure.

FIG. 10 shows a flow diagram of a method for operating a measurement application device. The method comprises receiving S1 an analog measurement signal, converting S2 the analog measurement signal into a digital data stream, storing S3 digital data stream sections of the digital data stream into each one of a plurality of memory segments of a memory, and creating S4 a trigger output signal based on a trigger condition definition and the digital data stream sections stored in each one of the single memory segments.

Figure 11:
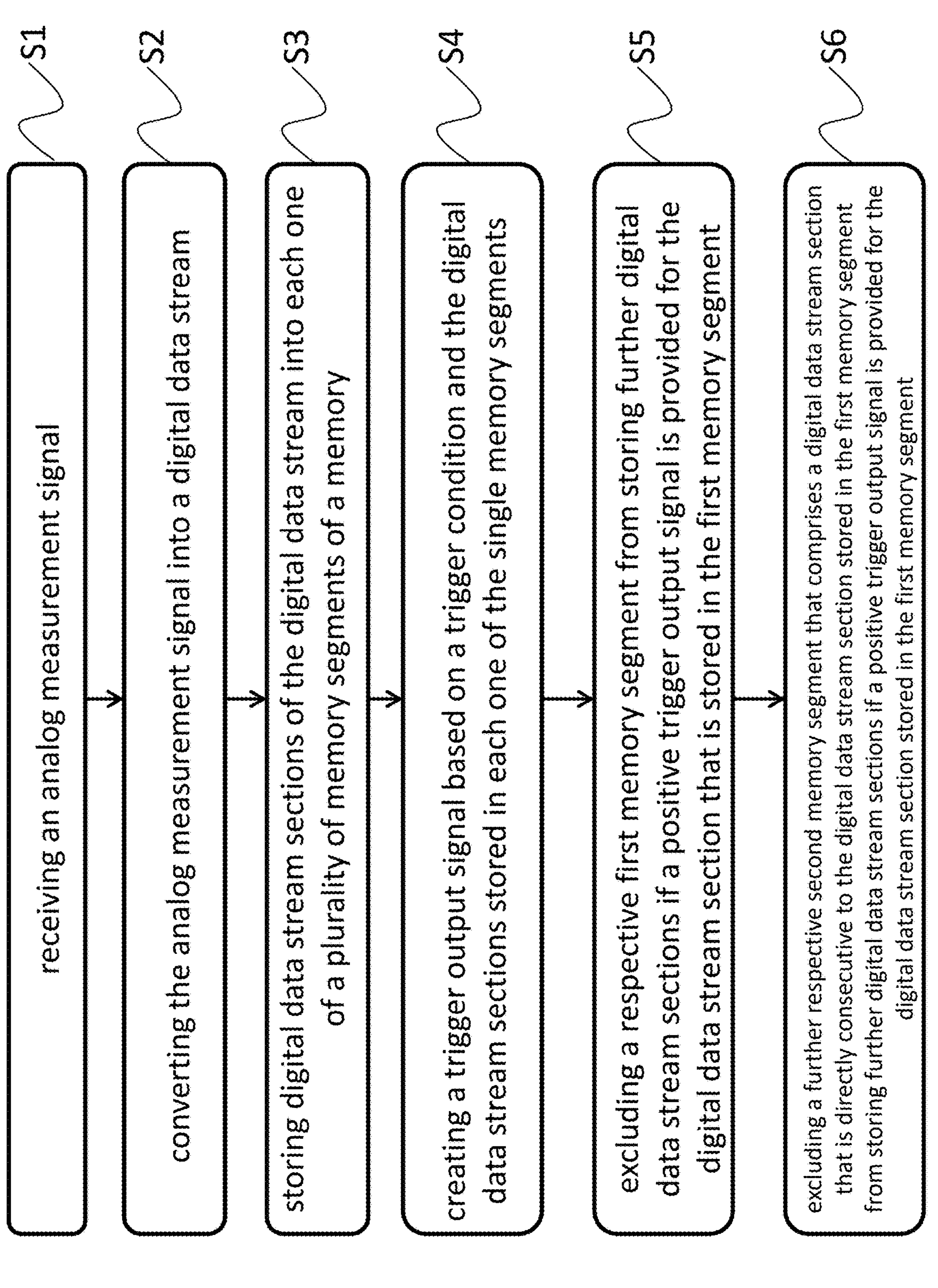
FIG. 11 shows a flow diagram of another embodiment of a method according to the present disclosure.

FIG. 11 shows a flow diagram of another method for operating a measurement application device. The method comprises receiving S1 an analog measurement signal, converting S2 the analog measurement signal into a digital data stream, storing S3 digital data stream sections of the digital data stream into each one of a plurality of memory segments of a memory, and creating S4 a trigger output signal based on a trigger condition definition and the digital data stream sections stored in each one of the single memory segments. The method further comprises excluding S5 a respective first memory segment from storing further digital data stream sections if a positive trigger output signal is provided for the digital data stream section that is stored in the first memory segment, and further excluding S6 a further respective second memory segment that comprises a digital data stream section that is directly consecutive to the digital data stream section stored in the first memory segment from storing further digital data stream sections if a positive trigger output signal is provided for the digital data stream section stored in the first memory segment.

The method may further comprise overwriting a memory segment when storing the digital data stream if a negative trigger output signal is provided by the trigger unit for the digital data stream section that is stored in the respective memory segment by instantaneously overwriting the respective memory segment with a further digital data stream section if a negative trigger output signal is provided by the trigger unit, or marking the respective memory segment for overwriting with a further digital data stream section if a negative trigger output signal is provided by the trigger unit, and writing the next further digital data stream section into a consecutive memory segment that is not excluded from storing.

Creating a trigger output signal may comprise consecutively comparing, for the one of the memory segments that data was last stored in, the digital data stream section stored in the respective memory segment with at least one predefined trigger zone definition, outputting a positive trigger output signal if the digital data stream section stored in the respective memory segment matches with the at least one predefined trigger zone definition, and outputting a negative trigger output signal if the digital data stream section stored in the respective memory segment does not match with the at least one predefined trigger zone definition.

Creating a trigger output signal further may comprise converting each one of the digital data stream sections into a respective pixel-based image, and comparing the pixel-based images with the at least one predefined trigger zone definition to determine the trigger output signal.

The at least one predefined trigger zone definition may comprise at least one of a definition of a geometric zone in a coordinate system corresponding to the pixel-based image, a threshold value, and a comparator function.

The comparator function may comprise one of a higher-than function, a lower-than function, an is-equal function, and an is-not-equal function.

Figure 12:
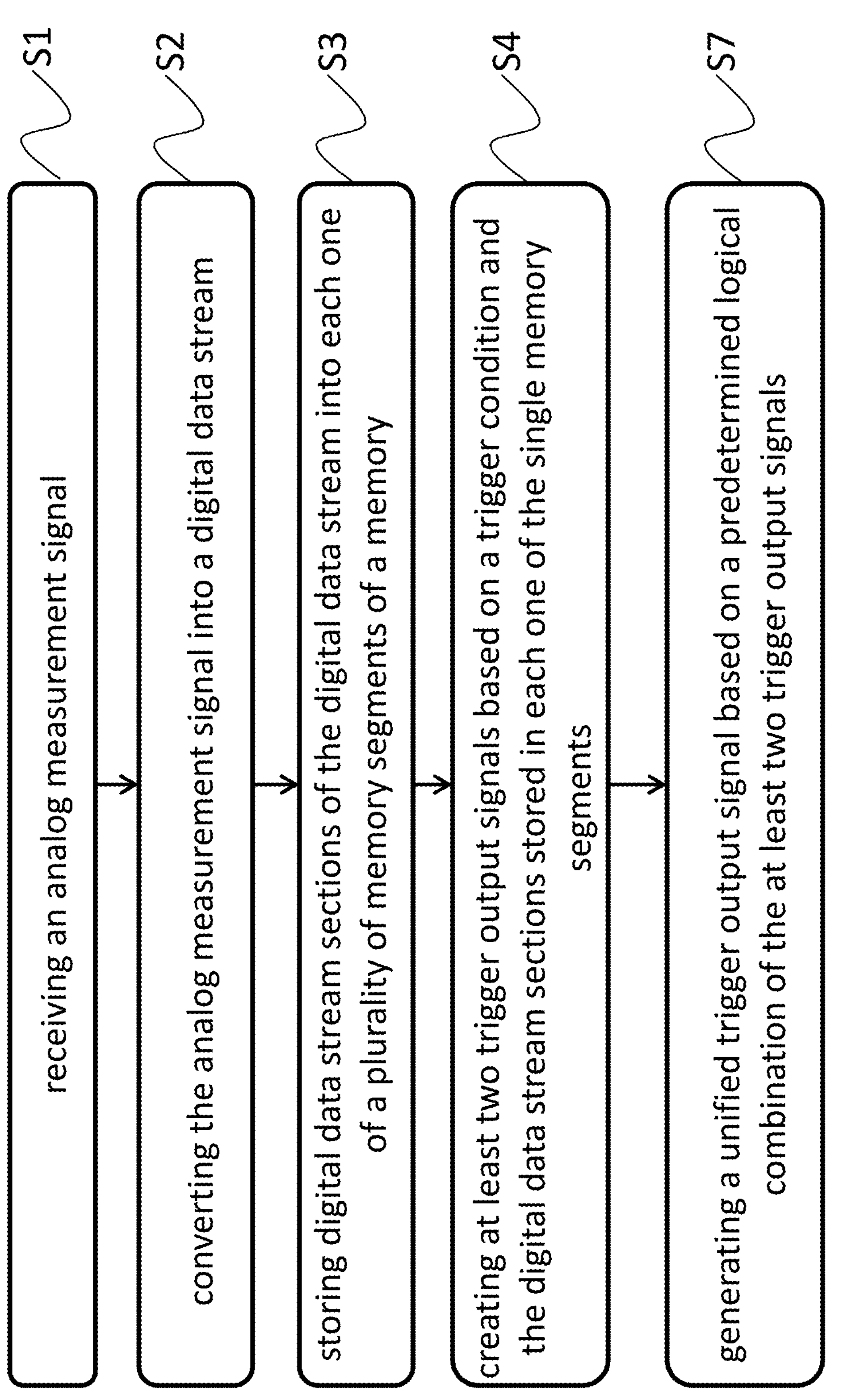
FIG. 12 shows a flow diagram of a further embodiment of a method according to the present disclosure.

FIG. 12 shows a flow diagram of another method for operating a measurement application device. The method comprises receiving S1 an analog measurement signal, converting S2 the analog measurement signal into a digital data stream, storing S3 digital data stream sections of the digital data stream into each one of a plurality of memory segments of a memory, and creating S4 a trigger output signal based on a trigger condition definition and the digital data stream sections stored in each one of the single memory segments. The method further comprises creating at least two trigger output signals, and generating a unified trigger output signal based on a predetermined logical combination of the at least two trigger output signals.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as “a,” “the,” “said,” etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS

100, 400, 500 measurement application device
101, 401, 501 measurement interface
102, 402, 502 analog measurement signal
103, 403, 503 analog-to-digital converter
104, 404, 504 digital data stream
105, 205, 305, 405, 505 segmented memory
106-1, 106-2, 206-1, 206-2, 306-1, 306-2 memory segments
406-1, 406-2, 506-1, 506-2 memory segments
107, 207, 307, 407, 507, 607 digital data stream section
108, 408, 508, 608, 708 trigger unit
109, 209, 309, 409, 509, 609, 709 trigger output signal
110, 410, 510 trigger condition definition
213, 313 memory
214, 314 memory controller
317 data input
318-1, 318-2 data output
319 data switch
422, 522, 622-1, 622-2, 722-1, 722-2 comparator
423, 523 trigger zone definition
525, 625 pixel converter
628, 728 trigger output signal comparator
S1-S7 method steps
OSC1 oscilloscope
HO housing
MIP1, MIP2, MIP3, MIP4 measurement input
SIP signal processing
DISP1 display
OSC oscilloscope
VS vertical system
SC signal conditioning
ATT attenuator
DAC1 analog-to-digital converter
AMP amplifier
FI1 filter
DAC digital-to-analog converter
ADC analog-to-digital converter
TS triggering section
AMP2 amplifier FI2 filter
TS1 trigger system
HS horizontal system
PS processing section
ACP acquisition processing element
MEM memory
PPE post processing element
DISP display

The invention claimed is:

1. A measurement application device comprising:
- a measurement interface configured to receive an analog measurement signal;
- an analog-to-digital converter coupled to the measurement interface, wherein the analog-to-digital converter is configured to convert the analog measurement signal into a digital data stream;
- a segmented memory coupled to the analog-to-digital converter, wherein the segmented memory comprises a plurality of memory segments and is configured to store digital data stream sections of the digital data stream into each one of the plurality of memory segments; and
- a trigger unit coupled to the segmented memory, wherein the trigger unit is configured to create a trigger output signal based on a trigger condition definition and the digital data stream sections stored in each one of the plurality of memory segments, wherein the trigger unit further comprises:
  - at least one pixel converter configured to convert incoming ones of the digital data stream sections into a pixel-based image, and
  - at least one comparator configured to compare the pixel-based image with the trigger condition definition to determine the trigger output signal.

2. The measurement application device according to claim 1, wherein the segmented memory comprises a memory, and a memory controller coupled to the memory, wherein the memory controller is configured to organize the memory into the plurality of memory segments and to control storing the digital data stream sections in the plurality of memory segments.

3. The measurement application device according to claim 2, wherein the memory controller is further configured to exclude a respective first memory segment of plurality of memory segments from storing further digital data stream sections when a positive trigger output signal is provided by the trigger unit for the digital data stream section that is stored in the first memory segment.

4. The measurement application device according to claim 3, wherein the memory controller is further configured to exclude a further respective second memory segment of the plurality of memory segments that comprises a digital data stream section that is directly consecutive to the digital data stream section stored in the first memory segment from storing further digital data stream sections when a positive trigger output signal is provided by the trigger unit for the digital data stream section stored in the first memory segment.

5. The measurement application device according to claim 2, wherein the memory controller is further configured to overwrite a memory segment of the plurality of memory segments when storing the digital data stream sections when a negative trigger output signal is provided by the trigger unit for the digital data stream section that is stored in a respective memory segment of the plurality of memory segments.

6. The measurement application device according to claim 5, wherein the memory controller is further configured to at least one of:
- instantaneously overwrite the respective memory segment with a further digital data stream section when a negative trigger output signal is provided by the trigger unit; or
- mark the respective memory segment for overwriting with a further digital data stream section when a negative trigger output signal is provided by the trigger unit, and write the next further digital data stream section into a consecutive memory segment that is not excluded from storing.

7. The measurement application device according to claim 3, wherein the memory controller comprises:
- a data input;
- a data output for each one of the plurality of memory segments; and
- a data switch coupled to the data input, wherein the data switch is configured to controllably couple the data input to one of the data outputs.

8. The measurement application device according to claim 1, wherein the at least one comparator is configured to:
- consecutively compare, for the one of the plurality of memory segments that data was last stored in, the digital data stream section stored in a respective memory segment with at least one predefined trigger zone definition;
- output a positive trigger output signal when the digital data stream section stored in the respective memory segment matches with the at least one predefined trigger zone definition; and
- output a negative trigger output signal when the digital data stream section stored in the respective memory segment does not match with the at least one predefined trigger zone definition.

9. The measurement application device according to claim 1, wherein the at least one predefined trigger zone definition comprises at least one of:
- a definition of a geometric zone in a coordinate system corresponding to the pixel-based image;
- a threshold value; or
- a comparator function.

10. The measurement application device according to claim 9, wherein the comparator function comprises one of:
- a higher-than function;
- a lower-than function;
- an is-equal function; or
- an is-not-equal function.

11. The measurement application device according to claim 8, comprising at least two comparators; and
- further comprising a trigger output signal comparator coupled to the at least two comparators;
- wherein the trigger output signal comparator is configured to generate a unified trigger output signal based on a predetermined logical combination of trigger output signals provided by the at least two comparators.

12. A method for operating a measurement application device, the method comprising:
- receiving an analog measurement signal;
- converting the analog measurement signal into a digital data stream;
- storing digital data stream sections of the digital data stream into each one of a plurality of memory segments of a memory; and
- creating, using a trigger unit, a trigger output signal based on a trigger condition definition and the digital data stream sections stored in each one of the plurality of memory segments, wherein creating a trigger output signal further comprises:

converting each one of the digital data stream sections into a respective pixel-based image, and comparing the pixel-based images with the trigger condition definition to determine the trigger output signal.

13. The method according to claim 12, further comprising excluding a respective first memory segment of plurality of memory segments from storing further digital data stream sections when a positive trigger output signal is provided for the digital data stream section that is stored in the first memory segment.

14. The method according to claim 13, further comprising excluding a further respective second memory segment of plurality of memory segments that comprises a digital data stream section that is directly consecutive to the digital data stream section stored in the first memory segment from storing further digital data stream sections when a positive trigger output signal is provided for the digital data stream section stored in the first memory segment.

15. The method according to claim 12, further comprising overwriting a memory segment of the plurality of memory segments when storing the digital data stream when a negative trigger output signal is provided by a trigger unit for the digital data stream section that is stored in a respective memory segment of the plurality of memory segments by:

instantaneously overwriting the respective memory segment with a further digital data stream section when a negative trigger output signal is provided by the trigger unit; or marking the respective memory segment for overwriting with a further digital data stream section when a negative trigger output signal is provided by the trigger unit, and writing the next further digital data stream section into a consecutive memory segment that is not excluded from storing.

16. The method according to claim 12, wherein creating a trigger output signal comprises:

consecutively comparing, for the one of the plurality of memory segments that data was last stored in, the digital data stream section stored in a respective memory segment with at least one predefined trigger zone definition;

outputting a positive trigger output signal when the digital data stream section stored in the respective memory segment matches with the at least one predefined trigger zone definition; and outputting a negative trigger output signal when the digital data stream section stored in the respective memory segment does not match with the at least one predefined trigger zone definition.

17. The method according to claim 12, wherein the at least one predefined trigger zone definition comprises at least one of:

a definition of a geometric zone in a coordinate system corresponding to the respective pixel-based image;

a threshold value; or a comparator function; and wherein the comparator function comprises one of:

a higher-than function;

a lower-than function;

an is-equal function; or an is-not-equal function.

18. The method according to claim 16, further comprising:

creating at least two trigger output signals; and generating a unified trigger output signal based on a predetermined logical combination of the at least two trigger output signals.

19. A measurement application device comprising:

a measurement interface configured to receive an analog measurement signal;

an analog-to-digital converter coupled to the measurement interface, wherein the analog-to-digital converter is configured to convert the analog measurement signal into a digital data stream;

a segmented memory coupled to the analog-to-digital converter, wherein the segmented memory comprises a plurality of memory segments and is configured to store digital data stream sections of the digital data stream into each one of the plurality of memory segments; and a trigger unit coupled to the segmented memory, wherein the trigger unit is configured to create a trigger output signal based on a trigger condition definition and the digital data stream sections stored in each one of the plurality of memory segments, the trigger unit further comprising:

at least one comparator configured to compare a pixel-based image with the trigger condition definition to determine the trigger output signal, wherein the trigger condition definition comprises a comparator function, wherein the comparator function comprises one of:

a higher-than function;

a lower-than function;

an is-equal function; or an is-not-equal function.

* * * * *